US005708354A

United States Patent [19]

Hancock et al.

[11] Patent Number: 5,708,354

[45] Date of Patent: Jan. 13, 1998

[54] PORTABLE ELECTROMAGNETIC ACOUSTIC TRANSDUCER PULSER CONTROLLER

[75] Inventors: Jimmy W. Hancock; Daniel T. MacLauchlan, both of Lynchburg; Charles B. Overby, Gladys, all of Va.

[73] Assignee: McDermott Technology, Inc., New Orleans, La.

[21] Appl. No.: 768,733

[22] Filed: Dec. 18, 1996

[51] Int. Cl.$^6$ .......... H03K 17/72

[52] U.S. Cl. .......... 323/265

[58] Field of Search .......... 323/264–265, 323/24–26, 22

[56] References Cited

U.S. PATENT DOCUMENTS

| | | | |
|---|---|---|---|
| 3,622,960 | 11/1971 | Barron | 307/262 |
| 3,872,326 | 3/1975 | Krishna et al. | 307/252 |
| 3,940,685 | 2/1976 | Ebata | 323/23 |

OTHER PUBLICATIONS

Electrical component catalog entitled "Vicor Express", published on or about May, 1995 by Vicor Corporation. Entire photocopy of catalog supplied. (Pertinent pages: pp. 24–25.).

*Primary Examiner*—Aditya Krishnan

*Attorney, Agent, or Firm*—Robert J. Edwards; Robert P. Bennett; Eric Marich

[57] ABSTRACT

A variable power source is provided having multiple power modules each of which can produce a portion of the total range of voltage required for pulsed operation of an electromagnetic acoustic transducer electromagnet. The power modules are connected in series, and controlled by individual potentiometers which are simultaneously adjusted. Selector switches are provided for enabling or disabling each module. The output of the power modules is connected to a pulser/controller for wave forming prior to sending the output signal to the electromagnet. A noise filter can be placed between the power modules and the pulser. LED-type indicators on the selector switches may be used to indicate the operational status of the modules.

7 Claims, 1 Drawing Sheet

PORTABLE ELECTROMAGNETIC ACOUSTIC TRANSDUCER PULSER CONTROLLER

BACKGROUND OF THE INVENTION

1. Field of the Invention

The present invention relates generally to the field of non-destructive testing and in particular to controlling the magnet of an electromagnetic acoustic transducer with a novel switching circuit.

2. Description of the Related Art

Electromagnetic acoustic transducers are commonly used to non-destructively test welds and materials in environments, such as industrial furnaces and boilers, where visual or physical inspection does not reveal defects. Electromagnetic acoustic transducers can be placed or sent into areas where larger testing equipment cannot obtain access as well.

The magnetic field required by an electromagnetic acoustic transducer sensor may be supplied by a rare earth permanent magnet or an electromagnet. When the application requires a pulsed electromagnet, a switching circuit is necessary to provide the pulsing. The design of the magnet determines the field strength (the current level), voltage, pulse width, pulse repetition rate, and other parameters which influence the inspection capabilities of the electromagnetic acoustic transducer.

Field inspections require that equipment be portable, lightweight, and reliable, as well as capable of providing the necessary current and voltage for operation. Prior known switching control equipment consists of large, heavy (150 lbs or greater) laboratory equipment which uses a 480 VAC power source. In many cases, this equipment is too bulky and does not fit into the areas which are to be inspected, such as through the man-ways of boilers.

SUMMARY OF THE INVENTION

It is an object of the present invention to provide a small, portable electromagnetic acoustic transducer magnet pulser which can be easily transported and used in field inspections.

It is a further object of the invention to provide a switching control circuit for a power source of a pulser for an electromagnetic acoustic transducer electromagnet which can deliver between 0 and 200 VDC.

Accordingly, a pulser and switchable power source system are provided having multiple power modules each of which can produce a portion of the total range of voltage required for pulsed operation of an electromagnetic acoustic transducer electromagnet. The modules are connected in series, and controlled by individual potentiometers which can be simultaneously adjusted by an operator. Switches are provided for enabling or disabling each module. The output of the power modules is connected to a pulser/controller for wave forming prior to sending the output signal to the electromagnet.

Optionally, a noise filter can be placed between the power modules and the pulser. LED-type indicators on the switches may be used to indicate the operational status of the modules as well.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

DESCRIPTION OF THE PREFERRED EMBODIMENTS

Figure 1:
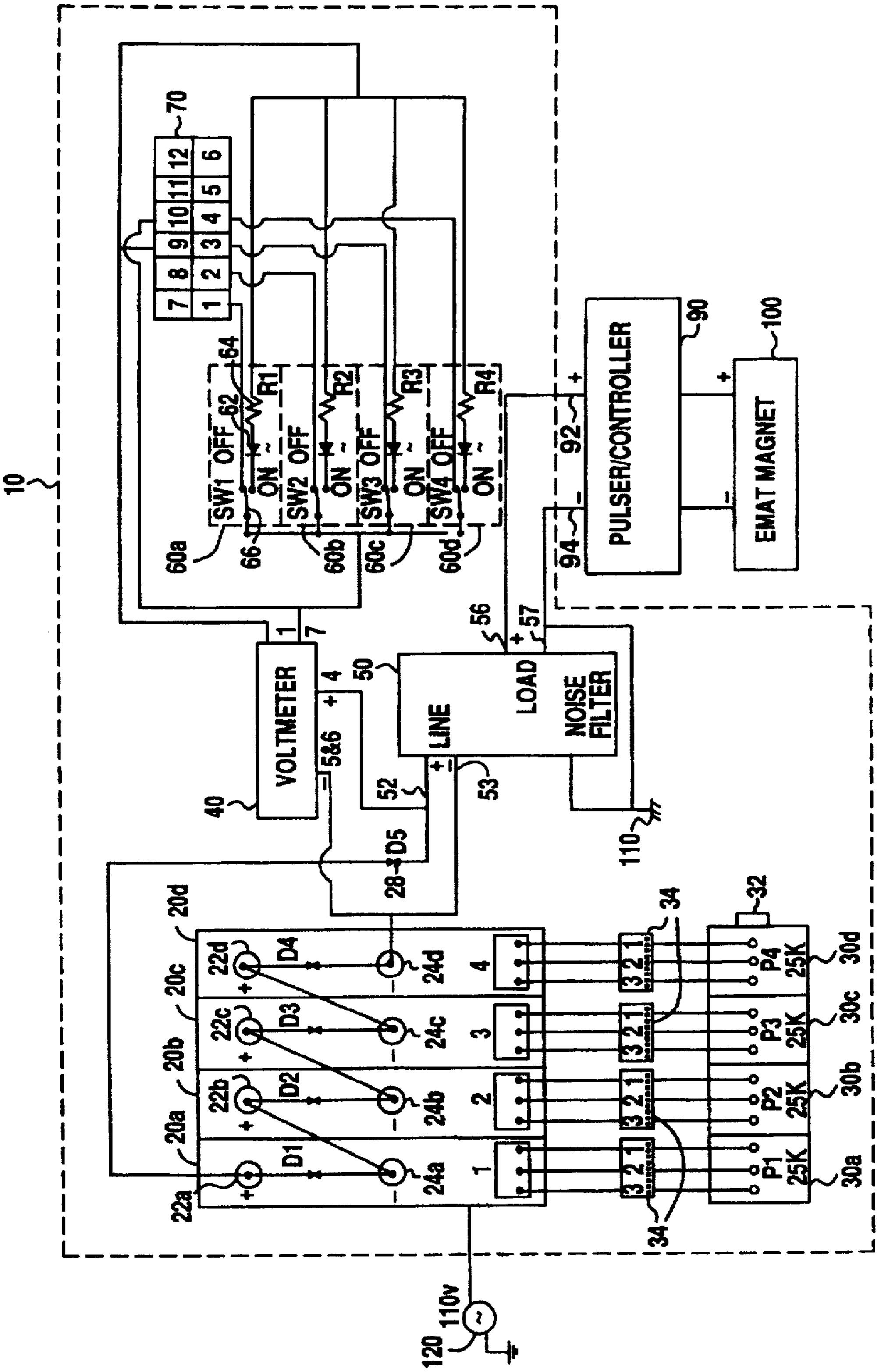
FIG. 1 is a schematic circuit diagram showing a switched power source and pulser for an electromagnetic acoustic transducer electromagnet according to the invention.

Referring now to the drawing, a variable DC power source 10 according to the invention is connected to a pulser 90 for driving an electromagnetic acoustic transducer electromagnet 100. The pulser 90 can be any known type of pulse forming circuit for shaping the output signal of the variable DC power source 10 before it is delivered to the electromagnet 100. Power is supplied to the variable DC power source by a standard 110 VAC supply 120, such as from a wall outlet.

Variable power source 10 has variable power modules **20*a*–20*d* connected in series. The power modules 20*a*–20*d* have diodes 26*a*–26*d* placed across the positive terminals 22*a*–22*d* and negative terminals 24*a*–24*d* of each module 20*a*–20*d*, respectively. The diodes 26*a*–26*d* are oriented to provide reverse voltage protection for each module, that is the cathode of each diode 26*a*–26*d* is connected to the positive terminals 22*a*–22*d***.

A ganged potentiometer 32 is used to simultaneously control the magnitude of the output voltage of the power modules **20*a*–20*d*. Ganged potentiometer 32 has individual sections 30*a*–30*d* for controlling each power module 20*a*–20*d*. Each section 30*a*–30*d* is connected to one of the power modules 20*a*–20*d* using a bus or other standard connector 34**. Shielded wires may be used as well.

Module selectors **60*a*–60*d* are connected to control jumper block 70 for enabling or disabling power modules 20*a*–20*d*. Each selector 60*a*–60*d* has a switch 66 and may have an LED 62 and current limiting resistor 64 in series on the enabled, or ON side of the switch 66. Control jumper block 70 is an integrated portion of power modules 20*a*–20*d*, although the jumper block 70 is shown detached from the modules 20*a*–20*d* in the drawing. Jumper block 70 as shown has 12 pin connections. Pins 1–4 are digital switches corresponding to the four modules 20*a*–20*d*, respectively. The voltage present at each pin is biased high (+5 VDC), enabling the corresponding module; when any of pins 1–4 is connected to ground, the corresponding module is disabled. Pin 9 is a +5 VDC power source and pin 10** is connected to ground.

The selectors **60*a*–60*d* are connected at their common to ground pin 10 of jumper block 70. The OFF position of each selector 60*a*–60*d* is connected to the corresponding pin 1–4 of jumper block 70. When the switch 66 is in the OFF position, the connected pin 1–4 of jumper block 70 is grounded, disabling the corresponding module 20*a*–20*d*. When the switch 66 is in the ON position, current is allowed to flow through the resistor 64, activating LED 62 to indicate that the corresponding module 20*a*–20*d* is enabled, as the corresponding pin 1–4 of jumper block 70** is not grounded, and therefore remains biased high.

A voltmeter 40 may be connected between negative terminal **24*d* and the cathode of diode 28 to measure the total DC voltage supplied by the power modules. Power may be supplied to the voltmeter 40 at pins 1 and 7 of the voltmeter 40 from pins 9 and 10 of the jumper block 70**.

The output from the power modules at positive terminal 22*a* is connected to a noise filter 50 at filter positive terminal 52 through output line diode 28. The output line diode 28 is oriented with the cathode connected to the filter positive terminal 52, in order to provide reverse voltage protection to the combined power modules 20*a*–20*d*. The filter 50 is connected to a ground 110, such as a chassis ground. The filter positive output 56 is connected to the pulser positive terminal 92. The pulser negative terminal 94 and filter negative terminal 57 are connected to ground 110.

Components which are acceptable for use with the circuit described above include VICOR model M48N 4.2 AF modules for power modules 20*a*–20*d*, a standard 4-stage 25 KΩ ganged potentiometer for potentiometer 32, TEXMATE model DVM-5 voltmeter for voltmeter 40 and a CORCOM 10KV3 filter for noise filter 50. Control jumper block 70 can be a standard VICOR modular switcher power supply main frame interface connector. Current limiting resistors 64 may have a value of 330 ohms.

A variable power source 10 powered only by a 110 VAC source 120 using these components can provide from 28–200 VDC by enabling and disabling the power modules 20*a*–20*d*, and varying potentiometer 32, each of which individually can provide between 24 and 48 VDC.

The power source 10 according to the invention using the items above is compact (approximately 13"×13"×7.5") and lightweight (less than 30 lbs.).

Using the power modules 20*a*–20*d* with the switching and diodes 26*a*–26*d*, 28, a reliable, portable and easy to use variable DC power source 10 is obtained which can be used with known pulsers 90 to drive an electromagnetic acoustic transducer electromagnet 100 during field inspections.

While a specific embodiment of the invention has been shown and described in detail to illustrate the application of the principles of the invention, it will be understood that the invention may be embodied otherwise without departing from such principles.

What is claimed is:

1. A variable DC power supply for driving a pulser connected to an electromagnet of an electromagnetic acoustic transducer, the power supply comprising:

at least two variable voltage power modules, each module having positive and negative terminals, the modules electrically connected in series such that one positive terminal on one power module is a power module output, the modules for converting AC voltage to DC voltage;

an AC power supply connected to the at least two power modules;

potentiometer means for varying the voltage output of each power module;

diode protection means on each power module for preventing reverse voltages from forming across the positive and negative terminals of each module; and switching means for selectively enabling and disabling each power module.

2. A variable DC power supply according to claim 1, further comprising noise filter means for producing a clean DC voltage to supply to the pulser connected to the output of the power modules.

3. A variable DC power supply according to claim 2, further comprising a voltmeter connected across the output of the power modules and a ground.

4. A variable DC power supply according to claim 3, wherein the diode protection means comprises at least two diodes, one diode connected between the positive and negative terminals of each power module, such that the cathode of each diode is connected at the positive terminal.

5. A variable DC power supply according to claim 4, further comprising an output diode connected between the output of the power modules and the noise filter, such that the anode of the output diode is connected to the output.

6. A variable DC power supply according to claim 5, wherein the switching means further comprises indicating means for indicating when each of the at least two power modules is enabled.

7. A variable DC power supply according to claim 6, wherein the at least two power modules comprises four power modules.

* * * * *